United States Patent
Huang et al.

(10) Patent No.: US 8,917,806 B1
(45) Date of Patent: Dec. 23, 2014

(54) DIGITAL PHASE-LOCKED LOOP AND PHASE/FREQUENCY DETECTOR MODULE THEREOF

(71) Applicant: Richtek Technology Corp, Hsinchu (TW)

(72) Inventors: Yen-Yin Huang, Hsinchu (TW); Kuo-Shih Tsai, Hsinchu (TW); Ming-Shih Yu, Hsinchu (TW)

(73) Assignee: Richtek Technology Corp, Hsinchu (TW)

( * ) Notice: Subject to any disclaimer, the term of this patent is extended or adjusted under 35 U.S.C. 154(b) by 0 days.

(21) Appl. No.: 14/256,031

(22) Filed: Apr. 18, 2014

(30) Foreign Application Priority Data

Oct. 18, 2013 (TW) .............................. 102137670 A

(51) Int. Cl.
*H03D 3/24* (2006.01)
*H04L 7/033* (2006.01)

(52) U.S. Cl.
CPC .................................... *H04L 7/0331* (2013.01)
USPC ........................................................ 375/375

(58) Field of Classification Search
CPC ....... H04L 7/033; H04L 7/027; H04L 7/0331; H03L 7/087; H03L 7/0891
USPC .................. 375/375, 376, 294, 327; 327/156; 455/307, 325; 331/177 R
See application file for complete search history.

(56) References Cited

U.S. PATENT DOCUMENTS

2007/0230650 A1* 10/2007 Roethig ......................... 375/376
2014/0002153 A1* 1/2014 Yang ............................. 327/158

* cited by examiner

*Primary Examiner* — Khai Tran
(74) *Attorney, Agent, or Firm* — Chun-Ming Shih

(57) ABSTRACT

A phase/frequency detector module, applicable to a digital phase-locked loop, includes: an edge detector for receiving a reference clock signal and a counting clock signal, where when a positive edge of the counting clock signal occurs, if a positive edge of the reference clock signal has occurred, the edge detector outputs an edge-detected signal, else the edge detector outputs an edge-not-detected signal; a counter coupled to the edge detector, where if receiving the edge-detected signal, the counter outputs a counting result forming a frequency error signal, resets, and loads a count value, and if receiving the edge-not-detected signal, the counter continues to count on the positive edge of the counting clock signal; and a frequency phase converter for performing integration over the counting result, where the integral forms a phase error signal.

26 Claims, 9 Drawing Sheets

DIGITAL PHASE-LOCKED LOOP AND PHASE/FREQUENCY DETECTOR MODULE THEREOF

CROSS REFERENCE TO RELATED APPLICATIONS

This non-provisional application claims priority under 35 U.S.C. §119(a) on Patent Application No. 102137670 filed in Taiwan, R.O.C. on Oct. 18, 2013, the entire contents of which are hereby incorporated by reference herein.

BACKGROUND OF THE INVENTION

1. Field of the Invention

The present invention relates to a digital phase-locked loop and a phase/frequency detector module thereof and, more particularly, to a multi-mode digital phase-locked loop with short lock time and a phase/frequency detector module of simultaneously outputting the frequency error and phase error.

2. Description of Related Art

A phase-locked loop (PLL) is a device that generates an output signal to match in phase the frequency of an input signal and is an indispensable component in the design of communication systems. A PLL takes an original clock signal, which may contain a lot of noise, and generates a cleaner clock signal with higher signal-to-noise ratio (SNR) or a new clock signal with different frequency. Besides, a PLL, when applied in communication systems, is used in signal synchronization for clock recovery with respect to the signals received. As the technology of the semiconductor process advances rapidly, many components of communication systems have been assembled and implemented on integrated circuits, which meets manufacturing requirements of low costs, fast production, and miniaturization for communicating devices so that the communicating devices are made widely accessible in our daily life. Therefore, a single chip of integrated circuits that incorporates the PLL component has become a trend in the design of communication systems, as we already saw in most of existing consumer products.

In a convectional PLL design, there exists a certain design limitation between the frequency of the input reference clock signal and the loop bandwidth of the PLL. For example, if a frequency divider is not included at the input stage, the loop bandwidth, ideally, should not be more than one tenth of the frequency of the reference clock signal, and thus the loop bandwidth should be imposed an upper limit of frequency when the frequency of the input reference clock signal is at a low value. In prior-art analog PLL devices, because the frequency of the loop bandwidth is directly related to the resistance and capacitance of the loop filter, the resistance and capacitance may become substantially large when the loop bandwidth is low, and it may be adversely impossible to incorporate such resistors and capacitors with other circuits of the PLL component into a single chip, thereby inevitably increasing circuit dimensions and costs.

Moreover, in an analog PLL, when the frequency of the loop bandwidth is at a low value, the leakage current, caused by devices with large dimensions, may further result in a slower PLL response speed, that is, a longer lock time. Because it is not easy to adopt a multi-mode design in an analog PLL, for example, selecting between the phase-locked mode and frequency-locked mode, the lock time required before an analog PLL is operable may tend to be long. Further, the charge pump unit of the loop filter may cause a mismatch, due to changes of process variation, operating temperature, and the like, between the current of the top current source and the current of the down current source, resulting in an offset on the output frequency or the output phase. Still, an analog PLL finds it difficult to share design parameters among different processes; therefore, a re-design of parameters is necessary when converting processes, and a long simulation time, which is required in an analog PLL, may also cause higher design costs. Finally, the loop in an analog PLL, during activation, should always be maintained, making it not possible to trade off between system performance and power consumption by employing multiple power saving modes and to provide, depending on current system requirements, more flexibility by switching between operating modes.

The advent of semiconductor process technology has made the concept of digital signal processing more acceptable in terms of costs and performance. A digital PLL is thus developed based on the concept of digital signal process. Prior-art digital PLL designs include a time-to-digital converter (TDC) to convert analog-based time into digital data. A digital PLL is designed to easily, compared to an analog PLL, support multi-mode design, modes of which may include the free-running mode where only the digitally controlled oscillator (DCO) is activated and the fast-recovered mode where the result obtained by locking the previous event serves as the starting point of the current event. A digital PLL is able to switch between, depending on current system requirement, different operating modes so as to achieve optimized balance between system performance and power consumption. However, for prior-art digital PLLs, the TDC circuit requires more area and power consumption, and multi-mode digital PLLs may need different circuit blocks to operate under different operating modes, for example, a frequency detector for frequency-locked function or a phase/frequency detector (PFD) for phase-locked function and a frequency divider are needed in the digital PLL device. In addition, a multi-modulus divider (MMD) is required to support the mode of fractional-N PLL (FNPLL). In prior-art PFDs, the bang-bang PFD is the PFD type that consumes least area, but the bang-bang PFD has longer lock time and cannot be applied to the design of the frequency-locked loop (FLL) and the FNPLL.

Referring to Taiwan Patent No. I363499 in which a digital PLL is disclosed. In the invention, the TDC module 102 has a complicated circuit architecture, so an error protection method with respect to the TDC is provided. To support the mode of FNPLL, the invention also includes a complex MMD circuit and a delta-sigma modulator (DSM) on the feedback path, contributing to the complexity of the circuit architecture. The added complexity, however, introduces parasite effect in the circuit and thus limits the operation speed of the PLL.

BRIEF SUMMARY OF THE INVENTION

In view of the foregoing, the present invention provides a digital PLL and a PFD module thereof; more particularly, the present invention provides a simple-structured, multi-mode digital PLL with short lock time and a PFD module of simultaneously outputting the frequency error and phase error.

The present invention provides a PFD module applicable to a digital PLL. The PFD module includes a counting clock input terminal, a reference clock input terminal, a counting control terminal, a phase error output terminal, a frequency error output terminal, an edge detector, a counter, and a frequency phase converter.

The counting clock input terminal is for receiving a counting clock signal. The reference clock input terminal is for receiving a reference clock signal. The counting control terminal is for receiving a count value. The phase error output terminal is for outputting a phase error signal. The frequency error output terminal is for outputting a frequency error signal. The edge detector is provided with a detecting input terminal, a detecting clock terminal, and a detecting output terminal, where the detecting input terminal is coupled to the reference clock terminal and receives the reference clock signal, and the detecting clock terminal is coupled to the counting clock input terminal and receives the counting clock signal. When either a first edge or a second edge of the counting clock signal occurs, the edge detector detects whether or not a first edge of the signal at the reference clock input terminal has occurred, and if the first edge is detected, the detecting output terminal outputs an edge-detected signal, else the detecting output terminal outputs an edge-not-detected signal.

The counter is coupled to the detecting output terminal, the counting clock input terminal, and counting control terminal, and the counter is provided with a counting output terminal coupled to the frequency error output terminal. If the detecting output terminal outputs an edge-detected signal, the counter outputs the counting result as a frequency error signal at the counting output terminal, resets (i.e., returns to the initial state), and loads the count value. On the other hand, if the detecting output terminal outputs an edge-not-detected signal, the counter continues to count on the first edge or the second edge of the counting clock signal. The frequency phase converter is coupled to the counting output terminal so as to receive a counting result, and the frequency phase converter is provided with a converting output terminal coupled to the phase error output terminal. The frequency phase converter performs integration over the counting result and outputs the integral formed as the phase error signal to the converting output terminal.

The present invention provides another PFD module applicable to a digital PLL. The PFD module includes a counting clock input terminal, a reference clock input terminal, a phase error output terminal, a frequency error output terminal, an edge phase detector, a phase clock generator, and a frequency phase converter.

The counting clock input terminal is for receiving a counting clock signal. The reference clock input terminal is for receiving a reference clock signal. The phase error output terminal is for outputting a phase error signal, and the frequency error output terminal is for outputting a frequency error signal. The phase clock generator is coupled to the counting clock input terminal so as to receive the counting clock signal, and the phase clock generator generates multiple phase clock signals, where the phase clock signals have the same clock as the counting clock signal and the initial phases of the phase clock signals are uniformly distributed in the interval of half the cycle of the counting clock signal.

The edge phase detector is couple to the reference clock input terminal and the frequency error output terminal. The edge phase detector receives the multiple phase clock signals, where the multiple phase clock signals are used to define multiple phase regions. The edge phase detector also receives the reference clock signal and determines that if the two adjacent first edges of the reference clock signal separately occur in one of the phase regions or if they separately occur in two of the phase regions. If the two adjacent first edges separately occur in two different phase regions, then the distance between the two phase regions is defined as a phase difference, where the frequency error signal at the frequency error output terminal is related to the phase difference.

The frequency phase converter is coupled to the frequency error output terminal so as to receive the frequency error signal. The frequency phase converter is provided with a converting output terminal coupled to the phase error output terminal, where the frequency phase converter performs integration over the frequency error signal and outputs the integral formed as the phase error signal to the converting output terminal.

The present invention provides still another PFD module applicable to a digital PLL. The PFD module includes a counting clock input terminal, a reference clock input terminal, a phase error output terminal, a frequency error output terminal, a D-type flip-flop (DFF), and a frequency phase converter.

The counting clock input terminal is for receiving a counting clock signal. The reference clock input terminal is for receiving a reference clock signal. The phase error output terminal is for outputting a phase error signal and the frequency error output terminal is for outputting a frequency error signal. The DFF is provided with a data input terminal, a clock terminal, and a data output terminal, where the data input terminal is coupled to the reference clock input terminal, the clock terminal is coupled to the counting clock input terminal, and the output terminal is coupled to the frequency error output terminal. When either the first edge or the second edge of the counting clock signal, received by the clock terminal, occurs, the DFF latches the reference clock signal received at the input terminal and outputs the clock signal to the data output terminal.

The frequency phase converter is coupled to the data output terminal and provided with a converting output terminal coupled to the phase error output terminal, where the frequency phase converter performs integration over the signal at the data output terminal and outputs the integral formed as the phase error signal to the converting output terminal.

In addition to the PFD module, the present invention provides a digital PLL. The digital PLL includes a phase-locked input terminal, a PFD module, a digital low-pass filter (LF) module, a DCO, and a clock domain distribution module.

The phase-locked input terminal is for receiving reference clock signal. The PFD module is provided with a first clock input terminal, a reference clock input terminal, a phase error output terminal, and a frequency error output terminal, where the reference clock input terminal is coupled to the phase-locked input terminal. The PFD module detects a frequency difference and a phase difference between the first clock input terminal and the reference clock input terminal and outputs the frequency difference and the phase difference to the frequency error output terminal and the phase error output terminal respectively. The digital computation of the PFD module is performed based on the clock signal received at the first clock input terminal The digital LF module is provided with a phase error input terminal, a frequency error input terminal, a second clock input terminal, and a filtering output terminal. The digital LF module performs a low-pass filtering computation on the signals at the phase error input terminal and the frequency error input terminal and outputs the computed results to the filtering output terminal. The digital computation of the digital LF module is performed based on the clock signal received at the second clock input terminal.

The DCO is provided with a control input terminal, an oscillating output terminal, and a third clock input terminal, where the control input terminal is coupled to the filtering output terminal. The DCO determines the frequency of the clock signal at the oscillating output terminal according to the signal at the control input terminal. The digital computation of the digitally controlled oscillator is performed based on the clock signal received at the third clock input terminal.

Where the first clock input terminal, the second clock input terminal, and the third clock input terminal are separately coupled to the oscillating output terminal.

The advantageous effect of the present invention with reference to the prior art is that the present invention provides a novel circuit architecture by avoiding to use complicated devices, such as time-to-digital converter, multi-modulus divider, and the like, and by employing a relative simpler structure, for the phase-locked loop, frequency-locked loop, and fractional-N phase-locked loop; additionally, the digital phase-locked loop of the present invention supports multi-mode operation, for example, under free-running mode, fast-locked mode, and fast-recovered mode.

BRIEF DESCRIPTION OF THE SEVERAL VIEWS OF DRAWINGS

The structure as well as a preferred mode of use, further objects, and advantages of the present invention will be best understood by referring to the following detailed description of some illustrative embodiments in conjunction with the accompanying drawings, in which.

DETAILED DESCRIPTION OF THE PREFERRED EMBODIMENTS

In the description hereinafter, the term of "coupled" or "coupling" refers to any two objects directly or indirectly electrically connected to each other. Therefore, if it is described that "a first device is coupled to a second device," the meaning is that the first device is either directly electrically connected to the second device or indirectly electrically connected to the second device through other devices or connection means. Besides, "a first logic level" and "a second logic level" mean steady states of digital logic signals, which are usually understood as "1" and "0" in the art. For example, if "the first logic level" is defined as "1," then "the second logic level" is correspondingly defined as "0," and vice versa. Further, "a first edge" and "a second edge" mean transient states of digital logic signals, which are usually understood as "a positive edge" and "a negative edge" in the art. For example, if "the first edge" is defined as "the positive edge," then "the second edge" is correspondingly defined as "the negative edge," and vice versa.

Figure 1:
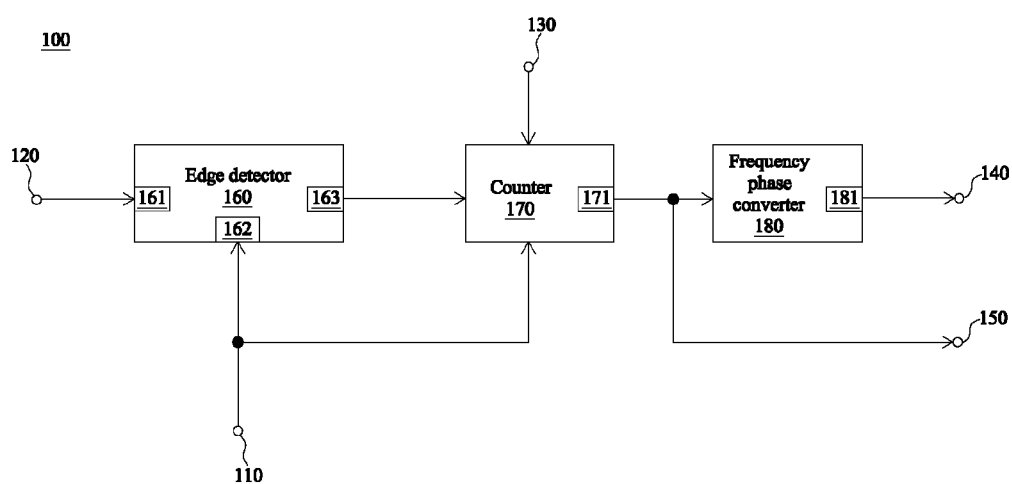
FIG. 1 is a block diagram of a phase/frequency detector module according to the first embodiment of the present invention.

FIG. 1 shows a block diagram of a PFD module 100 according to the first embodiment of the present invention. The PFD module 100 is applicable to a digital PLL and provided with a counting clock input terminal 110, a reference clock input terminal 120, a counting control terminal 130, a phase error output terminal 140, a frequency error output terminal 150, an edge detector 160, a counter 170, and a frequency phase converter 180.

As shown in FIG. 1, the counting clock input terminal 110 is for receiving a counting clock signal, and the reference clock input terminal 120 is for receiving a reference clock signal. The counting control terminal 130 is for receiving a count value. The phase error output terminal 140 is for outputting a phase error signal, and the frequency error output terminal 150 is for outputting a frequency error signal.

As shown in FIG. 1, the edge detector 160 is provided with a detecting input terminal 161, a detecting clock terminal 162, and a detecting output terminal 163, where the detecting input terminal 161 is coupled to the reference clock input terminal 120 so as to receive the reference clock signal, and the detecting clock terminal 162 is coupled to the counting clock input terminal 110 so as to receive the counting clock signal. When either a first edge or a second edge of the counting clock signal occurs, the edge detector 160 detects whether or not a first edge of the signal at the reference clock input terminal 120 has occurred, and if the first edge of the reference clock input terminal 120 is detected, the detecting output terminal outputs an edge-detected signal, else the detecting output terminal outputs an edge-not-detected signal.

As shown in FIG. 1, the counter 170 is coupled to the detecting output terminal 163, the counting clock input terminal 110, and the counting control terminal 130, and the counter 170 is provided with a counting output terminal 171 coupled to the frequency error output terminal 150. If the detecting output terminal 163 outputs an edge-detected signal, the counter 170 outputs the counting result as the frequency error signal at the counting output terminal 171, resets (i.e., returns to the initial state), and loads the count value. On the other hand, if the detecting output terminal 163 outputs an edge-not-detected signal, the counter 170 continues to count on the first edge or the second edge of the counting clock signal.

As shown in FIG. 1, the frequency phase converter 180 is coupled to the counting output terminal 171 so as to receive the counting result, and the frequency phase converter 180 is provided with a converting output terminal 181 coupled to the phase error output terminal 140. The frequency phase converter 180 performs integration over the counting result and outputs the integral formed as the phase error signal to the converting output terminal 181.

From the above description, the function of the PFD module 100 is to detect the frequency error and the phase error between the counting clock signal and the reference clock signal and output the frequency error and the phase error to the frequency error output terminal 150 and the phase error output terminal 140 respectively.

One example of the present embodiment is illustrated as follows. The first edge refers to the positive edge of the clock signal, and the second edge refers to the negative edge of the clock signal; the edge-detected signal refers to the digital signal "1", and the edge-not-detected signal refers to the digital signal "0." In the embodiment, the count value is default to 8, and the frequency of the counting clock signal is 6 times the frequency of the reference clock signal under transient state; the counter 170 is a down counter in which the count value to be loaded is the initial counting value, for example, 8, and the down-counting result of the down counter is the counting result. Therefore, when the positive edge of the counting clock signal of the edge detector 160 occurs, if the edge detector 160 detects that the positive edge of the signal at the reference clock input terminal 161 has occurred, the edge detector 160 outputs "1" at the detecting output terminal 163, and on receiving the signal, the counter 170 returns to the initial state and loads the count value, 8. On the following 5 positive edges of the counting clock signal, if the edge detector 160 detects that the positive edge of the signal of the reference clock input terminal 161 has not occurred, then the edge detector 160 outputs "0" to the detecting output terminal 163, and the counter 170 starts the down counting, i.e., the counting value is decremented by one, starting from the initial count value, 8. Next, on the 6th positive edge of the counting clock signal, if the edge detector 160 detects that the positive edge of the signal of the reference clock input terminal 161 has occurred, then the edge detector 160 outputs "1" to the detecting output terminal 163, and on receiving the signal, the counter 170 performs the last down counting and outputs the counting value, 2, as the frequency error signal, to the counting output terminal 171, and the counter 170 returns to the initial state and loads the current count value. The example shows that the PFD module 100 dynamically outputs the frequency error signal, a difference between the ideal value of the frequency of the counting clock signal over the frequency of the reference clock signal (i.e., the multiple) and the transient value of such multiple, at the frequency error output terminal 150, where the ideal value is 8, the transient value is 6, and the difference is 2. The frequency phase converter 180 performs integration over the frequency error signal and outputs the integral formed as the phase error signal to the phase error output terminal 140.

Another example of the present embodiment is illustrated as follows. The first edge refers to the positive edge of the clock signal, and the second edge refers to the negative edge of the clock signal; the edge-detected signal refers to the digital signal "1", and the edge-not-detected signal refers to the digital signal "0." In the embodiment, the count value is default to 8, and the frequency of the counting clock signal is 6 times the frequency of the reference clock signal under transient state; the counter 170 is an up counter in which the difference between the count value to be loaded and the up-counting value is the counting result. Therefore, when the positive edge of the counting clock signal of the edge detector 160 occurs, if the edge detector 160 detects that the positive edge of the signal at the reference clock input terminal 161 has occurred, the edge detector 160 outputs "1" at the detecting output terminal 163, and on receiving the signal, the counter 170 returns to the initial state and loads the count value, 8. On the following 5 positive edges of the counting clock signal, if the edge detector 160 detects that the positive edge of the signal of the reference clock input terminal 161 has not occurred, then the edge detector 160 outputs "0" to the detecting output terminal 163, and the counter 170 starts the up counting, i.e., the counting value is incremented by one, starting from the initial count value, 0. Next, on the 6th positive edge of the counting clock signal, if the edge detector 160 detects that the positive edge of the signal of the reference clock input terminal 161 has occurred, then the edge detector 160 outputs "1" to the detecting output terminal 163, and on receiving the signal, the counter 170 performs the last up counting and outputs the counting value, 2, as the frequency error signal, to the counting output terminal 171, and the counter 170 returns to the initial state and loads the current count value. The example shows that the PFD module 100 dynamically outputs the frequency error signal, a difference between the ideal value of the frequency of the counting clock signal over the frequency of the reference clock signal (i.e., the multiple) and the transient value of such multiple, at the frequency error output terminal 150, where the ideal value is 8, the transient value is 6, and the difference is 2. The frequency phase converter 180 performs integration over the frequency error signal and outputs the integral formed as the phase error signal to the phase error output terminal 140.

Figure 2:
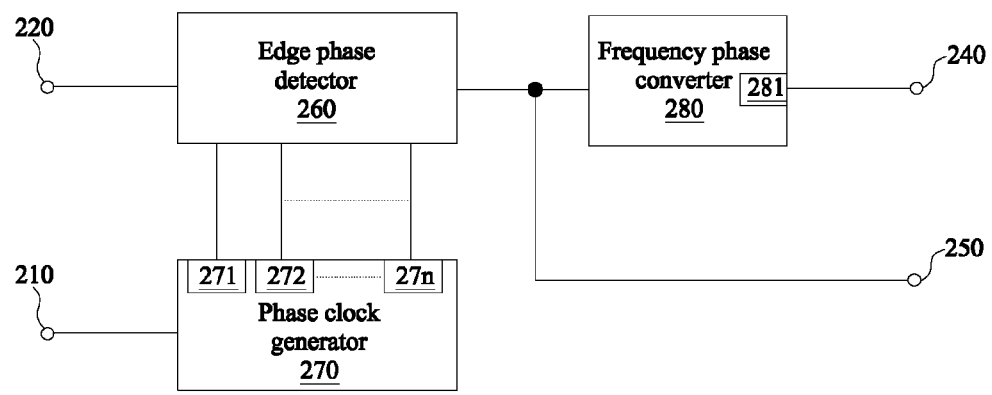
FIG. 2 is a block diagram of a phase/frequency detector module according to the second embodiment of the present invention.

FIG. 2 shows a block diagram of a PFD module 200 according to the second embodiment of the present invention. The PFD module 200 is applicable to a digital PLL and provided with a counting clock input terminal 210, a reference clock input terminal 220, a phase error output terminal 240, a frequency error output terminal 250, an edge phase detector 260, a phase clock generator 270, and a frequency phase converter 280.

As shown in FIG. 2, the counting clock input terminal 210 is for receiving a counting clock signal, and the reference clock terminal 220 is for receiving a reference clock signal. The phase error output terminal 240 is for outputting a phase error signal, and the frequency error output terminal 250 is for outputting a frequency error signal.

As shown in FIG. 2, the phase clock generator 270 is coupled to the counting clock input terminal 210 so as to receive the counting clock signal by which phase clock signals 291, 292, . . . , 29n are generated at phase clock output terminals 271, 272, . . . , 27n respectively. The phase clock signals 291, 292, . . . , 29n have the same clock frequency as the counting clock signal and the initial phases of the phase clock signals are uniformly distributed in the interval of half the cycle of the counting clock signal.

As shown in FIG. 2, the edge phase detector 260 is coupled to the reference clock input terminal 220 and the frequency error output terminal 250. The edge phase detector 260 receives the phase clock signals 291, 292, . . . , 29n, where the phase clock signals are used to define multiple phase regions. The edge phase detector 260 also receives the reference clock signal and determines that if the two adjacent first edges of the reference clock signal separately occur in one of the phase regions or if they separately occur in two of the phase regions. If the two adjacent first edges separately occur in two different phase regions, then the distance between the two phase regions is defined as a phase difference, where the frequency error signal at the frequency error output terminal 250 is related to the phase difference.

The frequency phase converter 280 is coupled to the frequency error output terminal 250 so as to receive the frequency error signal and provided with a converting output terminal 281 coupled to the phase error output terminal 240, where the frequency phase converter 280 performs integration over the frequency error signal and outputs the integral formed as the phase error signal to the converting output terminal 281.

Where a digital PLL that adopts the PFD module 200 is capable of locking the frequency and/or phase of a counting clock signal when the transient cycle of the counting clock signal is close enough to its steady cycle, for example, when the difference between the transient cycle and the steady cycle is smaller than half the steady cycle of the counting clock signal.

Figure 3:
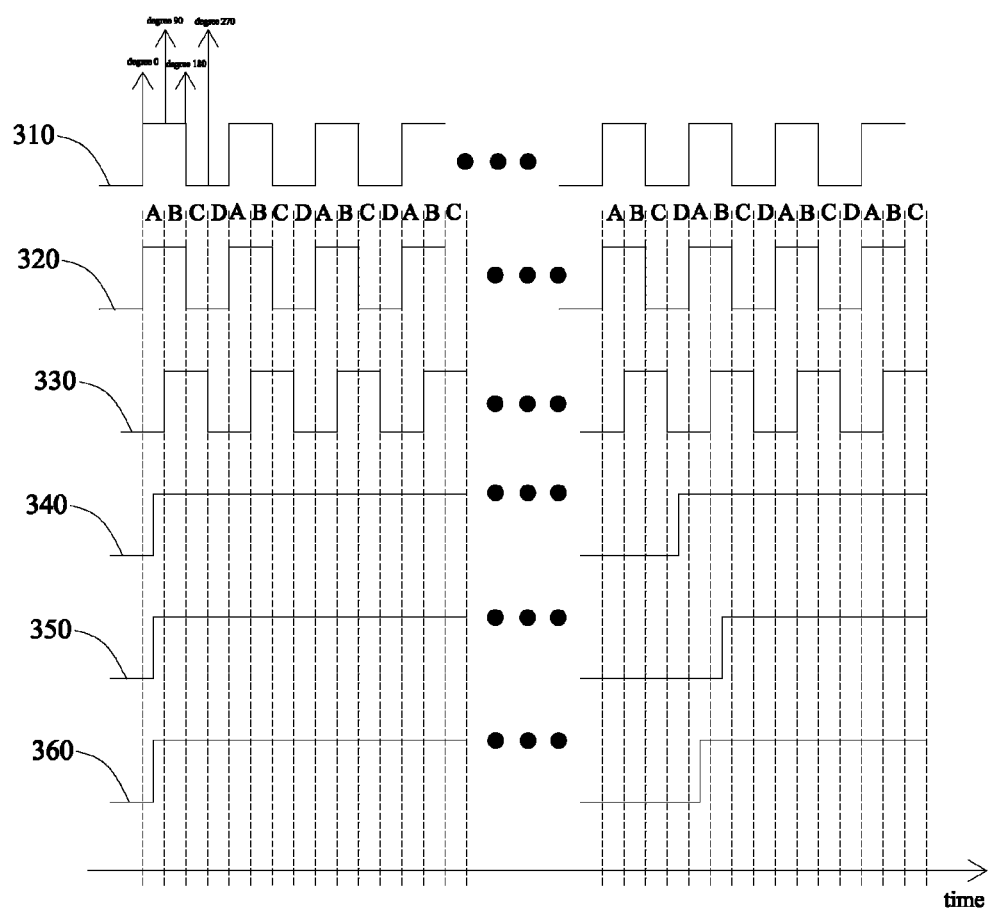
FIG. 3 is a timing diagram of a phase/frequency detector module according to the second embodiment of the present invention.

FIG. 3 shows a timing diagram of a PFD module 200 according to the second embodiment of the present invention. The timing 310 shows the timing of the counting clock signal.

The timing 320 and the timing 330 correspond to two phase clock signals generated by the phase clock generator 270. The respective initial phases of the timing 320 and the timing 330 are uniformly distributed in the interval of half the cycle of the counting clock signal, for example, the initial phase of the timing 320 is aligned to the counting clock signal at phase degree 0, and the initial phase of the timing 330 is aligned to the counting clock signal at phase degree 90. It should be easily derived that, based on above description, if the counting clock signal generates eight phase clock signals through the phase clock generator 270, then the initial timings of the eight phase clock signals correspond to 0, 22.5, 45, 67.5, 90, 112.5, 135, and 157.5 degrees respectively, that is, the eight initial phases are uniformly distributed in the interval of half the cycle of the counting clock signal, but the smallest initial phase is not necessarily aligned to the position of degree 0.

As shown in FIG. 3, the timings 320 and 330, formed by two phase clock signals respectively, define four phase regions, A, B, C, and D. According to the phase regions, A, B, C, and C, the edge phase detector 260 determines the position where the positive edge or the negative edge of the reference clock signal occurs. Take an example that the timing 340 indicates the timing of the reference clock signal and, as mentioned, the transient cycle of the counting clock signal is close enough to its steady cycle. As FIG. 3 indicates, the two adjacent positive edges of the timing 340 separately occur in the phase region A and the phase region D. However, the counting clock signal, once locked, should make the two adjacent positive edges of the timing 340 occur in the same phase region, and therefore, the edge phase detector determines that the counting clock signal is in a state of "running ahead." Because the phase region A is adjacent to the phase region D, the distance between the two regions is set to one. The edge phase detector 260 then outputs a signal denoted by "negative one" formed as a frequency error signal. The frequency phase converter 280 receives the frequency error signal and performs integration over the signal.

As another example, assume that the timing 350 indicates the timing of the reference clock signal, where the two adjacent positive edges of the timing 350 separately occur in the phase region A and the phase region B. In this case, the edge phase detector determines that the counting clock signal is in a state of "lagging behind." Because the phase region A is adjacent to the phase region B, the distance between the two regions is set to one. The edge phase detector 260 then outputs a signal denoted by "positive one" formed as a frequency error signal. The frequency phase converter 280 receives the frequency error signal and performs integration over the signal. When the counting clock signal is locked, the two adjacent positive edges of the reference clock signal occur in the same phase region A, as shown in the timing 360. It should be noted that in a real operation, the phase region is not limited to A.

Further, a person ordinarily skilled in the art should understand that, based on abovementioned description and concepts disclosed, when the phase clock generator 270 generates eight phase clock signals, which defines 16 phase regions, the edge phase detector 260, according to the respective phase regions in which the two adjacent positive (or negative) edges occur, outputs a corresponding integer denoted by "negative seven" to "positive seven" formed as a frequency error signal. The frequency phase converter 280 receives the frequency error signal and performs integration over the signal.

Figure 4:
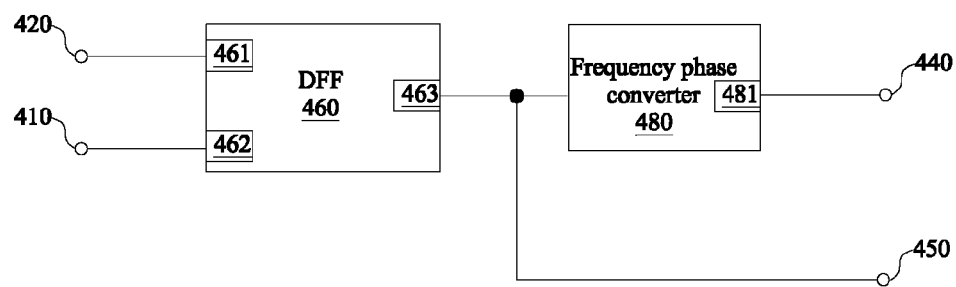
FIG. 4 is a block diagram of a phase/frequency detector module according to the third embodiment of the present invention.

FIG. 4 shows a block diagram of a PFD module 400 according to the third embodiment of the present invention. The PFD module 400 is applicable to a digital PLL and includes a counting clock input terminal 410, a reference clock input terminal 420, a phase error output terminal 440, a frequency error output terminal 450, a DFF 460, and a frequency phase converter 480.

As shown in FIG. 4, the counting clock input terminal 410 is for receiving a counting clock signal, and the reference clock input terminal 420 is for receiving a reference clock signal. The phase error output terminal 440 is for outputting a phase error signal, and the frequency error output terminal 450 is for outputting a frequency error signal.

As shown in FIG. 4, the DFF 460 is provided with a data input terminal 461, a clock terminal 462, and a data output terminal 463, where the data input terminal 461 is coupled to the reference clock input terminal 420, the clock terminal 462 is coupled to the counting clock input terminal 410, and the data output terminal 463 is coupled to the frequency error output terminal 450. When the first edge or the second edge of the counting clock signal, received at the clock terminal 462, occurs, the DFF 460 latches the reference clock signal received at the data input terminal 461 and outputs the data to the data output terminal 463.

As shown in FIG. 4, the frequency phase converter 480 is coupled to the data output terminal 463 and provided with a converting output terminal 481 coupled to the phase error output terminal 440. The frequency phase converter 480 performs integration over the signal at the data output terminal 463 and outputs the integral formed as the phase error signal to the converting output terminal 481.

Where a digital PLL that adopts the PFD module 400 is capable of locking the frequency and/or phase of a counting clock signal when the transient cycle of the counting clock signal is close enough to its steady cycle, for example, when the difference between the transient cycle and the steady cycle is smaller than half the steady cycle of the counting clock signal.

The embodiment of the PFD module 400 is exemplified as follows. When the positive edge of the counting clock signal "runs ahead" the positive edge of the reference clock signal, the DFF 460 latches a digital signal "0" on the positive edge of the reference clock signal and outputs the data, via the data output terminal 463, to the frequency error output terminal 450 and to the frequency phase converter 480. On receiving the digital signal "0", the frequency phase converter 480 recognizes that the positive edge of the counting clock signal "runs ahead" the positive edge of the reference clock signal and performs the integration over the signal. When the positive edge of the counting clock signal "lags behind" the positive edge of the reference clock signal, the DFF 460 latches a digital signal "1" on the positive edge of the reference clock signal and outputs the data, via the data output terminal 463, to the frequency error output terminal 450 and to the frequency phase converter 480. On receiving the digital signal "1", the frequency phase converter 480 recognizes that the positive edge of the counting clock signal "lags behind" the positive edge of the reference clock signal and performs the integration over the signal.

Figure 5:
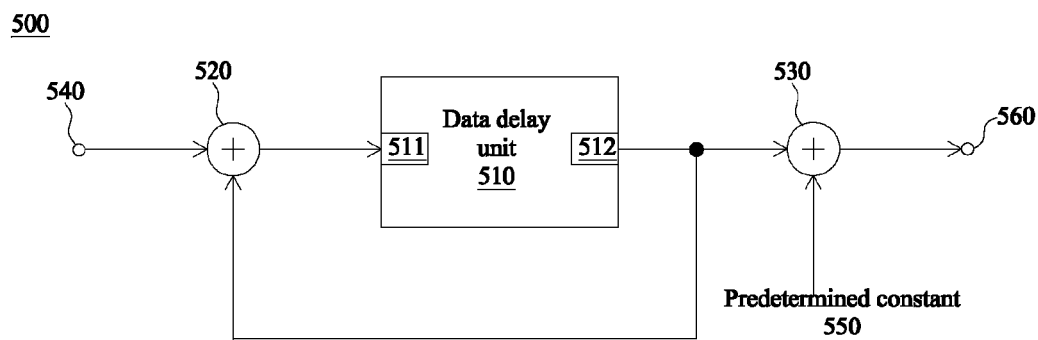
FIG. 5 is a block diagram of an embodiment of a frequency phase converter of the present invention.

FIG. 5 shows a block diagram of an embodiment of a frequency phase converter 500 of the present invention. The frequency phase converter 500 is applicable to any embodiment disclosed in the present invention. The frequency phase converter 500 includes a data delay unit 510, a first adder 520, and a second adder 530.

As shown in FIG. 5, the data delay unit 510 is provided with a delay input terminal 511 and a delay output terminal 512, where the signal at the delay input terminal 511 is delayed by a certain time interval before being outputted to the delay output terminal 512.

As shown in FIG. 5, the first adder 520 is provided with two input terminals and an output terminal. The two input terminals of the first adder 520 are coupled to the converting input terminal 540 of the frequency phase converter and the delay output terminal 512 respectively. The output terminal of the first adder 520 is coupled to the delay input terminal 511, where the first adder 520 adds the two signals at the two input terminals and outputs the result to the output terminal. The connection between the data delay unit 510 and the first adder 520 forms an integral circuit.

As shown in FIG. 5, the second adder 530 is provided with two input terminals and an output terminal. The two input terminals of the second adder 530 are coupled to the delay output terminal 512 and a predetermined constant 550 respectively, and the output terminal of the second adder 530 is coupled to the phase error output terminal 560, where the second adder 530 adds the two signals at the two input terminals and outputs the result to the output terminal. The effect of the second adder 530 is that when the digital PLL adopting the frequency phase converter is under a steady state, the predetermined constant 550, which defines a phase difference, is added between the reference clock signal and the counting clock signal so as to increase the stability and accuracy for phase locking. The ideal value of the predetermined constant 550 is set to quarter the cycle of the counting clock signal.

Figure 6:
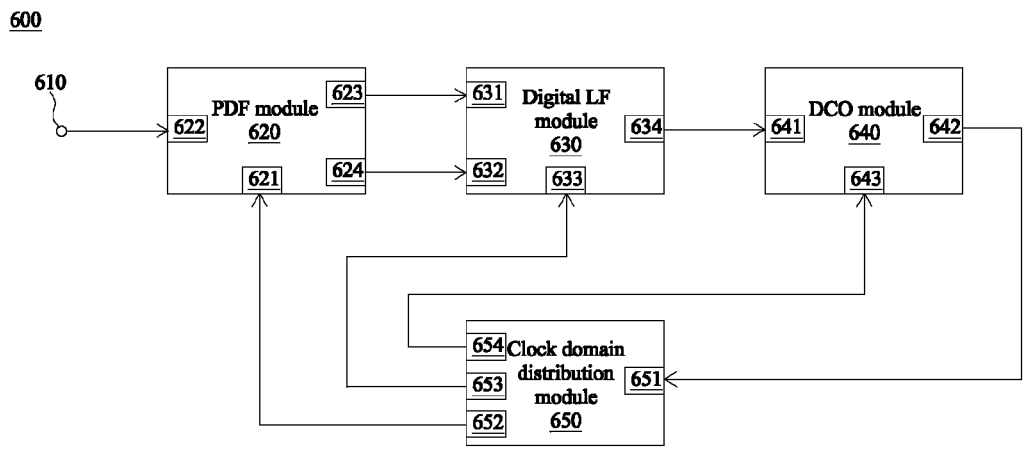
FIG. 6 is a block diagram of a digital phase-locked loop according to the fourth embodiment of the present invention.

FIG. 6 shows a block diagram of a digital PLL 600 according to the fourth embodiment of the present invention. The digital PLL 600 includes a phase-locked input terminal 610, a PFD module 620, a digital LF module 630, a DCO 640, and a clock domain distribution module 650.

As shown in FIG. 6, the phase-locked input terminal 610 is for receiving a reference clock signal. The PFD module 620 is provided with a first clock input terminal 621, a reference clock input terminal 622, a phase error output terminal 623, and a frequency error output terminal 624, where the reference clock input terminal 622 is coupled to the phase-locked input terminal 610. The PFD module 620 detects a frequency difference and a phase difference between the first clock input terminal 621 and the reference clock input terminal 622 and outputs the frequency difference and the phase difference to the frequency error output terminal 624 and the phase error output terminal respectively, and the digital operation of the PFD module 620 is operable on the clock signal received at the first clock input terminal 621.

As shown in FIG. 6, the digital LF module 630 is provided with a phase error input terminal 631, a frequency error input terminal 632, a second clock input terminal 633, and a filtering output terminal 634. The digital LF module 630 performs low-pass filtering operation on the signals of the phase error input terminal 631 and the frequency error input terminal 632 and outputs the results to the filtering output terminal 634, and the digital operation of the digital LF module 630 is operable on the clock signal received at the second clock input terminal 633.

As shown in FIG. 6, the DCO 640 is provided with a control input terminal 641, an oscillating output terminal 642, and a third clock input terminal 643, where the control input terminal 641 is coupled to the filtering output terminal 634. The DCO 640 determines the output frequency of the clock signal at the oscillating output terminal 642 according to the signal at the control input terminal 641, and the digital operation of the DCO 640 is operable on the clock signal received at the third clock input terminal 643.

Where the first clock input terminal 621, the second clock input terminal 633, and the third clock input terminal 643 are separately coupled to the oscillating output terminal 642. As shown in FIG. 6, for example, the clock domain distribution module 650 is provided with a clock distribution input terminal 651, a first clock output terminal 652, a second clock output terminal 653, and a third clock output terminal 654, where the clock distribution input terminal 651 is coupled to the oscillating output terminal 642. The first clock output terminal 652, the second clock output terminal 653, and the third clock output terminal 654 are coupled to the first clock input terminal 621, the second clock input terminal 633, and the third clock input terminal 643 respectively. The clock domain distribution module 650 performs integer division operations on the signal at the clock distribution input terminal 651 by three divisors and outputs the results to the first clock output terminal 652, the second clock output terminal 653, and the third clock output terminal 654 respectively.

As described in previous paragraph, the first clock output terminal 652, the second clock output terminal 653, and the third clock output terminal 654 may be directly coupled to the oscillating output terminal 642 and have the same clock frequency as the oscillating output terminal 642, or they may separately determine the clock frequency depending on the characteristics of the PFD module 620, the digital LF module 630, and the DCO 640. For example, in the digital PLL 600, when the frequency of the output signal is multiple times larger than that of the input signal, that is, if the frequency ratio between the signal at the oscillating output terminal 642 and the reference clock signal becomes larger, then it means that the refresh speed of the PFD module 620 is slower than that of the DCO 640. Therefore, the PFD module 620 can be operated under a lower clock frequency (i.e., a lower signal frequency at the first clock output terminal 652), thereby conserving power and reducing high-frequency interference while maintaining system performance.

Further, in the digital PLL 600, a phase-locked loop circuit is formed by the loop connection between the phase error output terminal 623 and the phase error input terminal 631, with respect to the operation of signals of phase difference; a frequency-locked loop circuit is also formed by the loop connection between the frequency error output terminal 624 and the frequency error input terminal 632, with respect to the operation of signals of frequency difference. The digital PLL 600 also supports multi-mode operation. The operation modes include, for example, the free-running mode, where the phase or frequency, after being locked, is used to determine the digital input to the DCO 640, while other units in the digital PLL, such as the PFD module 620, the digital LF module 630, and the clock domain distribution module 650, are shut off for conserving power; the fast-locked mode, where the phase-locked operation starts with a first-order PLL for locking the frequency, achieving a fast response speed, and follows with a second-order PLL for locking the phase; and the fast-recovered mode, where the previously locked result is used as the starting point for the next phase-locked or frequency-locked operation.

In addition, at the first clock input terminal 621, if the cycle of the transient state of the signal is close enough to the cycle of the steady state of the signal, for example, when the difference between the cycle of the transient state and the cycle of the steady state is smaller than half the cycle of the steady state, the PFD module 620 can be replaced with the PFD module 200 disclosed in the second embodiment of the present invention or the PFD module 400 in the third embodiment of the present invention, where the first clock input terminal 621 is corresponding to the counting clock input terminals 210 and 410.

Figure 7:
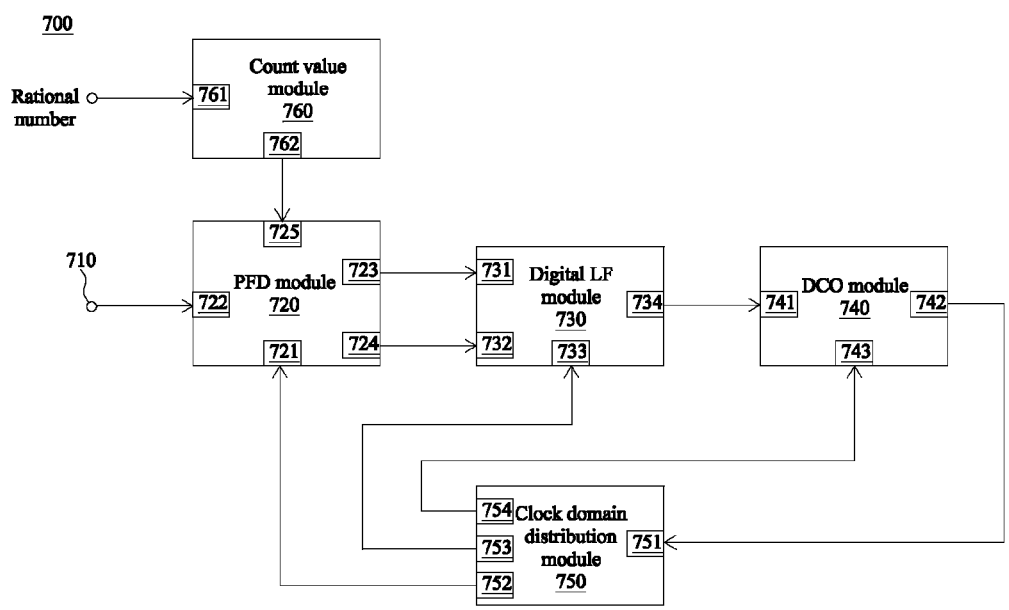
FIG. 7 is a block diagram of a digital phase-locked loop according to the fifth embodiment of the present invention.

FIG. 7 shows a block diagram of a digital PLL 700 according to the fifth embodiment of the present invention. The digital PLL 700 includes a phase-locked input terminal 710, a PFD module 720, a digital LF module 730, a DCO module 740, a clock domain distribution module 750, and a count value modulator 760.

As shown in FIG. 7, the phase-locked input terminal 710 is for receiving a reference clock signal. The PFD module 720 is provided with a first clock input terminal 721, a reference clock input terminal 722, a phase error output terminal 723, a frequency error output terminal 724, and a counting control terminal 725, where the reference clock input terminal 722 is coupled to the phase-locked input terminal 710. The PFD module 720 detects a frequency difference and a phase difference between the first clock input terminal 721 and the reference clock input terminal 722 and outputs the frequency difference and the phase difference to the frequency error output terminal 724 and the phase error output terminal 723 respectively. The digital operation of the PFD module 720 is operable on the clock signal received at first clock input terminal 721. The counting control terminal 725, an input terminal of the PFD module 720, is for receiving a count value, where the count value is an integer defining the multiple of the transient frequency of the clock signal at the first clock input terminal 721 over the transient frequency of the reference clock signal. The PFD module 720 can be replaced with the PFD module 100 disclosed in first embodiment of the present invention, where the first clock input terminal 721 is corresponding to the counting clock input terminal 110.

The design approach and operations for the digital LF module 730, the DCO 740, and the clock domain distribution module 750 can be referred to the digital LD module 630, the DCO 640, and the clock domain distribution module 650 disclosed in the fourth embodiment of the present invention, as shown in FIG. 6. Referring to FIG. 7 with reference to FIG. 6, the phase error input terminal 731, the frequency error input terminal 732, the second clock input terminal 733, the filtering output terminal 734, the control input terminal 741, the oscillating output terminal 742, the third clock input terminal 743, the clock distribution input terminal 751, the first clock output terminal 752, the second clock output terminal 753, and the third clock output terminal 754 are corresponding to the phase error input terminal 631, the frequency error input terminal 632, the second clock input terminal 633, the filtering output terminal 634, the control input terminal 641, the oscillating output terminal 642, the third clock input terminal 643, the clock distribution input terminal 651, the first clock output terminal 652, the second clock output terminal 653, and the third clock output terminal 654, respectively.

As shown in FIG. 7, the count value modulator 760 is provided with a counting input terminal 761 and a counting output terminal 762, where the counting output terminal 762 is coupled to the counting control terminal 725. The count value modulator 760 modulates a rational number, as the input, at the counting input terminal 761 into a dynamic integer and outputs the result to the counting output terminal 762.

Comparing to the digital PLL 600, the digital PLL 700 achieves the function of a FNPLL by incorporating the count value modulator 760. Based on an expected multiple, in terms of a rational number, the frequency of the steady state of the reference clock signal, comparing with the frequency of the steady state of the clock signal at the first clock input terminal 721, the count value modulator 760 is configured to output a group of dynamic data consisting of integers, as the control signal of the PFD module 720, to the counting control terminal 725. Therefore, the count value modulator 760 can be, but not limited to, a DSM. Persons ordinarily skilled in the art should find it easy to implement the count value modulator 760 by referring to design specification and application.

Besides, the rational number at the counting input terminal may be a dynamic data, for example, a dynamic input data with a spread-spectrum characteristic. The digital PLL 700 takes such input data and generates a clock signal with a spread-spectrum characteristic so as to achieve better electromagnetic compliance (EMC).

In the digital PLL 700, a phase-locked loop circuit is formed by the loop connection between the phase error output terminal 723 and the phase error input terminal 731, with respect to the operation of signals of phase difference; a frequency-locked loop circuit is also formed by the loop connection between the frequency error output terminal 724 and the frequency error input terminal 732, with respect to the operation of signals of frequency difference. Moreover, the dynamic control over the PFD module 720 by the count value modulator 760 corresponds to the function of a FNPLL. The digital PLL 700 also supports multi-mode operation including, for example, the free-running mode, the fast-locked mode, and the fast-recovered mode.

Figure 8:
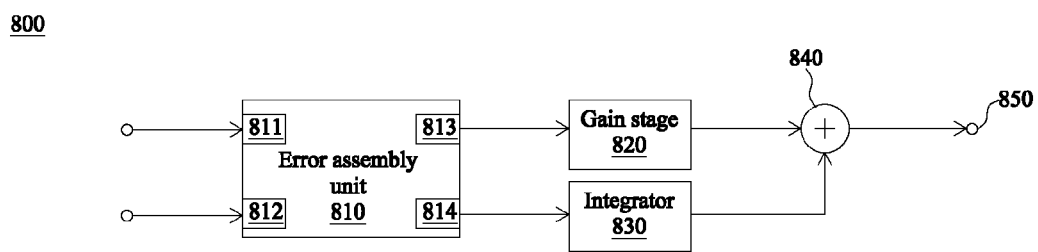
FIG. 8 is a block diagram of an embodiment of a digital low-pass filter module of the present invention.

FIG. 8 shows a block diagram of an embodiment of a digital LF module 800 of the present invention. The digital LF module 800 includes an error assembly unit 810, a gain stage 820, an integrator 830, and an adder 840.

As shown in FIG. 8, the error assembly unit 810 is provided with a phase error input terminal 811, a frequency error input terminal 812, a multiple output terminal 813, and an integral output terminal 814, where the phase error input terminal 811 is for receiving a phase error signal and the frequency error input terminal 812 is for receiving a frequency error signal. In the error assembly unit 810, the phase error input terminal 811 is selectively coupled to, or not coupled to, the multiple output terminal 813 and the frequency error input terminal 812 is selectively coupled to, or not coupled to, the multiple output terminal 813; the phase error input terminal 811 is selectively coupled to, or not coupled to, the integral output terminal 814 and the frequency error input terminal 812 is selectively coupled to, or not coupled to, the integral output terminal 814.

As shown in FIG. 8, the gain stage 820 is provided with an input terminal and an output terminal, where the input terminal is coupled to the multiple output terminal. The gain stage 820 multiplies the signal at the input terminal by a gain and output the result to the output terminal. The integrator 830 is provided with an input terminal and an output terminal, where the input terminal is coupled to the output terminal. The integrator 830 performs integration over the signal at the input terminal and outputs the integral result to the output terminal. The adder 840 is provided with two input terminals and an output terminal, where the two input terminals are coupled to the output terminal of the gain stage 820 and the output terminal of the integrator 830 respectively, and the output terminal of the adder 840 is coupled to the filtering output terminal 850. The adder 840 adds the signals at the two input terminals and output the result to the output terminal.

Figure 9A:
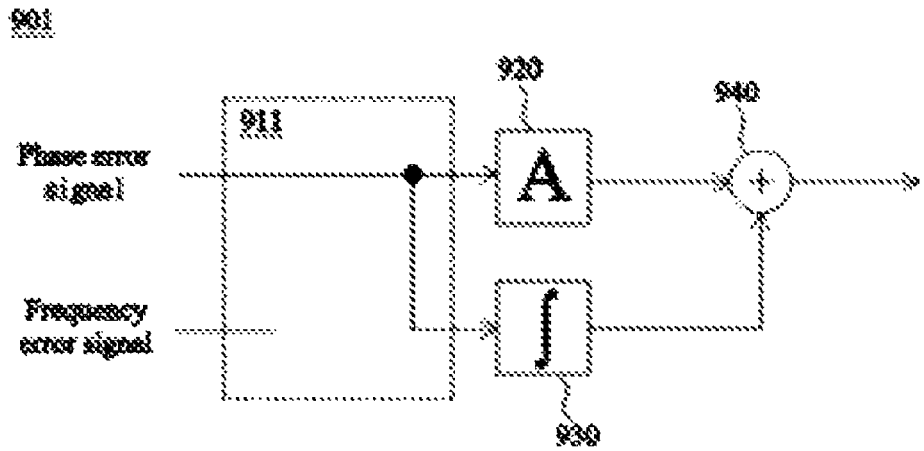
FIG. 9A is a signal flow diagram of an aspect of a digital low-pass filter module of the present invention.

FIG. 9A shows a signal flow diagram 901 of an aspect of a digital LF module 800 of the present invention. The portion of the signal flow 911 is corresponding to the signal flow of the error assembly unit 810. The stage of gain 920, the stage of integration 930, and the stage of addition 940 are corresponding to the gain stage 820, the integrator 930, and the adder 840 respectively. As shown in FIG. 9A, the signal flow 911 indicates that in the error assembly unit 810, the phase error signal is selectively coupled to the multiple output terminal 813 and the integral output terminal 814, and the signal, amplified by the stage of gain 920 and the signal through the stage of integral 930 are added and outputted to the filtering output terminal 850. The signal flow 911 also indicates that there is no operation on the frequency error signal in the digital LF module 800. The connection aspect of the signal flow diagram 901 allows a digital PLL adopting the digital LF module 800 to perform a phase-locked operation, where the loop refers to as a second-order loop.

Figure 9B:
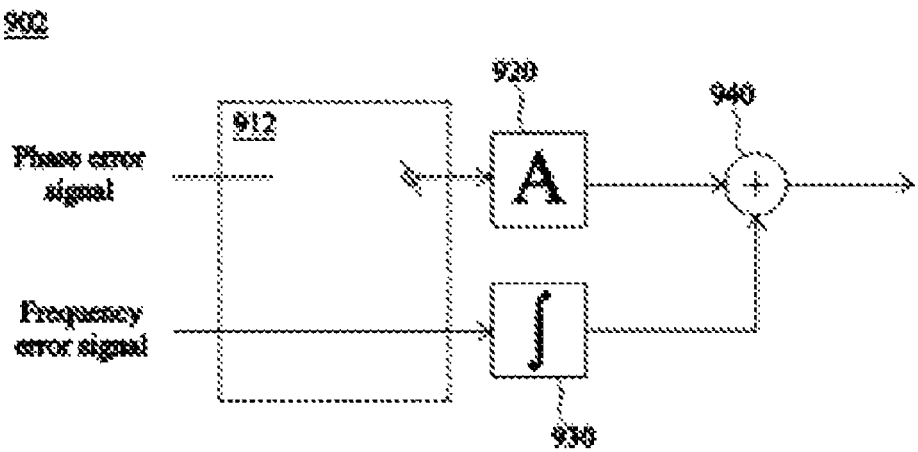
FIG. 9B is a signal flow diagram of another aspect of a digital low-pass filter module of the present invention.

FIG. 9B shows a signal flow diagram 902 of another aspect of a digital LF module 800 of the present invention. The portion of the signal flow 912 is corresponding to the signal flow of the error assembly unit 810. As shown in FIG. 9B, the signal flow 912 indicates that in the error assembly unit 810, the frequency error signal is selectively coupled to the integral output terminal 814, and the signal, after the integral operation by the stage of integral 930, is outputted to the filtering output terminal 850. The signal flow 912 also indicates that there is no operation on the phase error signal in the digital LF module 800. The connection aspect of the signal flow diagram 902 allows a digital PLL adopting the digital LF module 800 to perform a frequency-locked operation, where the loop refers to as a first-order loop.

Figure 9C:
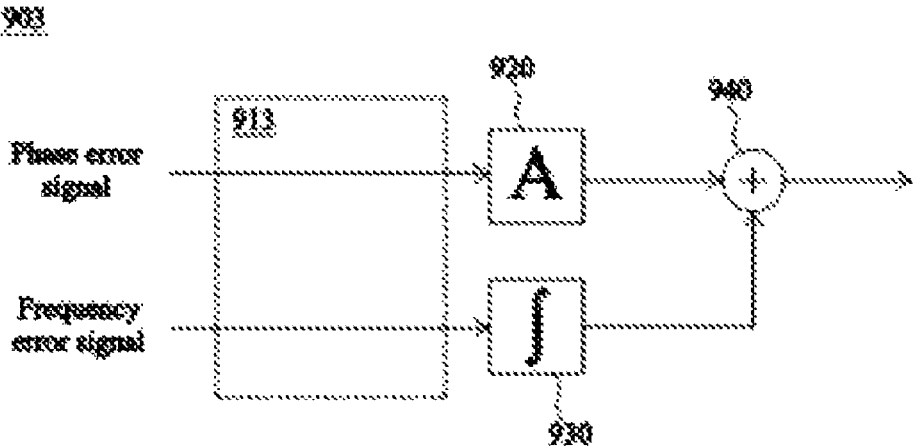
FIG. 9C is a signal flow diagram of still another aspect of a digital low-pass filter module of the present invention.

FIG. 9C shows a signal flow diagram 903 of still another aspect of a digital LF module 800 of the present invention. The portion of the signal flow 913 is corresponding to the signal flow of the error assembly unit 810. As shown in FIG. 9C, the signal flow 913 indicates that in the error assembly unit 810, the phase error signal and the frequency error signal are selectively coupled to the multiple output terminal 813 and the integral output terminal 814 respectively, and the phase error signal, amplified by the stage of gain 920, and the frequency error signal through the stage of integral 930 are added and outputted to the filtering output terminal 850. The connection aspect of the signal flow diagram 902 allows a digital PLL adopting the digital LF module 800 to perform a phase-locked operation. The equivalent transfer function associated with the signal flow diagram 903 is not equal to that associated with the signal flow diagram 901; therefore, the digital PLLs that adopt different aspects of the digital LF module provide different characteristics, for example, different loop response speeds and noise filtering capability, which serve flexibility to meet different requirements.

For the frequency-locked operation, the digital LF module 800, under the initial state of the phase-locked loop, first adopts the signal connection shown in FIG. 9B so as to perform a faster frequency-locked operation, and when the frequency is locked to be stable, the digital LF module 800 adopts the signal connection shown in FIG. 9A so as to perform an accurate phase-locked operation. Through the connection switching, the phase-locked operation disclosed in the present invention not only requires less time but also achieves higher accuracy.

The advantageous effect of this disclosure with reference to the prior art is that the present invention provides a novel circuit architecture by avoiding to use complicated devices, such as TDC, MMD, and the like, and by employing a relative simpler structure, for the phase-locked loop, frequency-locked loop, and FNPLL; additionally, the digital PLL of the present invention supports multi-mode operation, for example, under free-running mode, fast-locked mode, and fast-recovered mode.

The foregoing embodiments are illustrative of the characteristics of the present invention so as to enable a person skilled in the art to understand the disclosed subject matter and implement the present invention accordingly. The embodiments, however, are not intended to restrict the scope of the present invention. Hence, all equivalent modifications and variations made in the foregoing embodiments without departing from the spirit and principles of the present invention should fall within the scope of the appended claims.

What is claimed is:

1. A phase/frequency detector (PFD) module, applicable to a digital phase-locked loop (PLL), said PFD module comprising:
   a counting clock input terminal for receiving a counting clock signal;
   a reference clock input terminal for receiving a reference clock signal;
   a counting control terminal for receiving a count value;
   a phase error output terminal for outputting a phase error signal;
   a frequency error output terminal for outputting a frequency error signal;
   an edge detector provided with a detecting input terminal, a detecting clock terminal, and a detecting output terminal, said detecting input terminal being coupled to said reference clock input terminal and receiving said reference clock signal, said detecting clock terminal being coupled to said counting clock input terminal and receiving said counting clock signal, wherein when either a first edge or a second edge of said counting clock signal occurs, said edge detector detects whether or not a first edge of the signal at said reference clock input terminal has occurred, and if the first edge of said reference clock input terminal is detected, said detecting output terminal outputs an edge-detected signal, else said detecting output terminal outputs an edge-not-detected signal;
   a counter coupled to said detecting output terminal, said counting clock input terminal, and said counting control terminal, being provided with a counting output terminal coupled to said frequency error output terminal, wherein if said detecting output terminal outputs said edge-detected signal, then said counter outputs a counting result as said frequency error signal at said counting output terminal, resets, and loads said count value, and wherein if said detecting output terminal outputs said edge-not-detected signal, then the counter continues to count on the first edge or the second edge of said counting clock signal; and
   a frequency phase converter coupled to said counting output terminal for receiving said counting result, being provided with a converting output terminal coupled to said phase error output terminal, wherein said frequency phase converter performs integration over said counting result and outputs the integral formed as said phase error signal to said converting output terminal.

2. The PFD module as of claim 1, wherein said counter is a down counter, and said count value loaded to said counter is an initial counting value, and the down-counting result of said down counter forms said counting result.

3. The PFD module as of claim 1, wherein said frequency phase converter further comprising:
   a data delay unit provided with a delay input terminal and a delay output terminal, wherein the signal at said delay input terminal is delayed by a certain time interval before being outputted to said delay output terminal;
   a first adder provided with two input terminals and an output terminal, said two input terminals of said first adder being coupled to said frequency error output terminal and said delay output terminal respectively, said output terminal being coupled to said delay input terminal, wherein said first adder adds the two signals at said two input terminals and outputs a result to said output terminal; and
   a second adder provided with two input terminals and an output terminal, said two input terminals being coupled to said delay output terminal and a predetermined constant respectively, said output terminal being coupled to said phase error output terminal, wherein said second adder adds the two signals at said two input terminals and outputs a result to said output terminal.

4. The PFD module as of claim 3, wherein said predetermined constant is equivalent to the quarter the cycle of said counting clock signal.

5. The PFD module as of claim 1, wherein said counter is an up counter and the difference between said count value loaded to said counter and the up-counting result of said up counter forms said counting result.

6. The PFD module as of claim 5, wherein said frequency phase converter further comprising:
   a data delay unit provided with a delay input terminal and a delay output terminal, wherein the signal at said delay input terminal is delayed by a certain time interval before being outputted to said delay output terminal;
   a first adder provided with two input terminals and an output terminal, said two input terminals of said first adder being coupled to said frequency error output terminal and said delay output terminal respectively, said output terminal being coupled to said delay input terminal, wherein said first adder adds the two signals at said two input terminals and outputs a result to said output terminal; and
   a second adder provided with two input terminals and an output terminal, said two input terminals being coupled to said delay output terminal and a predetermined constant respectively, said output terminal being coupled to said phase error output terminal, wherein said second adder adds the two signals at said two input terminals and outputs a result to said output terminal.

7. The PFD module as of claim 6, wherein said predetermined constant is equivalent to the quarter the cycle of said counting clock signal.

8. A phase/frequency detector (PFD) module, applicable to a digital phase-locked loop (PLL), said PFD module comprising:
   a counting clock input terminal for receiving a counting clock signal;
   a reference clock input terminal for receiving a reference clock signals;
   a phase error output terminal for outputting a phase error signal;
   a frequency error output terminal for outputting a frequency error signal;
   a phase clock generator coupled to said counting clock input terminal for receiving said counting clock signal by which a plurality of phase clock signals are generated, each said phase clock signal having the same clock frequency as the counting clock signal, wherein the initial phases of said phase clock signals are uniformly distributed in the interval of half the cycle of said counting clock signal;
   an edge phase detector coupled to said reference clock input terminal and said frequency error output terminal, said edge phase detector receiving said phase clock signals, wherein said phase clock signals are used to define a plurality of phase regions, and said edge phase detector receives said reference clock signal and determines that if the two adjacent first edges of said reference clock signal separately occur in one of said phase regions or if they separately occur in two of said phase regions, and wherein if the two adjacent first edges separately occur in two different phase regions, then the distance between said two phase regions is defined as a phase difference, and said frequency error signal at said frequency error output terminal is related to said phase difference; and
   a frequency phase converter coupled to said frequency error output terminal for receiving said frequency error signal, said frequency phase converter being provided with a converting output terminal coupled to said phase error output terminal, wherein said frequency phase converter performs integration over said frequency error signal and outputs the integral formed as said phase error signal to said converting output terminal.

9. The PFD module as of claim 8, wherein said frequency phase converter further comprising:
   a data delay unit provided with a delay input terminal and a delay output terminal, wherein the signal at said delay input terminal is delayed by a certain time interval before being outputted to said delay output terminal;
   a first adder provided with two input terminals and an output terminal, said two input terminals of said first adder being coupled to said frequency error output terminal and said delay output terminal respectively, said output terminal being coupled to said delay input terminal, wherein said first adder adds the two signals at said two input terminals and outputs a result to said output terminal; and
   a second adder provided with two input terminals and an output terminal, said two input terminals being coupled to said delay output terminal and a predetermined constant respectively, said output terminal being coupled to said phase error output terminal, wherein said second adder adds the two signals at said two input terminals and outputs a result to said output terminal.

10. The PFD module as of claim 9, wherein said predetermined constant is equivalent to the quarter the cycle of said counting clock signal.

11. A digital phase-locked loop (DPLL), comprising:
   a phase-locked input for receiving a reference clock signal;
   a phase/frequency detector (PFD) module provided with a first clock input terminal, a reference clock input terminal, a phase error output terminal, and a frequency error output terminal, said reference clock input terminal being coupled to said phase-locked input terminal, wherein said PFD module detects a frequency difference and a phase difference between said first clock input terminal and said reference clock input terminal and outputs said frequency difference and said phase difference to said frequency error output terminal and said phase error output terminal respectively, and the digital operation of said PFD module is operable on the clock signal received at said first clock input terminal;
   a digital low-pass filter (LF) module provided with a phase error input terminal, a frequency error input terminal, a second clock input terminal, and a filtering output terminal, wherein the digital LF module performs low-pass filtering operations on the signals of said phase error input terminal and said frequency error input terminal and outputs the results to said filtering output terminal, and the digital operation of said digital LF module is operable on the clock signal received at said second clock input terminal; and
   a digitally controlled oscillator (DCO) provided with a control input terminal, an oscillating output terminal, and a third clock input terminal, said control input terminal being coupled to said filtering output terminal, wherein the DCO determines the output frequency of said clock signal at said oscillating output terminal according to the signal at said control input terminal, and the digital operation of said DCO is operable on the clock signal received at said third clock input terminal;

wherein said first clock input terminal, said second clock input terminal, and said third clock input terminal are separately coupled to said oscillating output terminal.

12. The DPLL as of claim 11, further comprising:
a clock domain distribution module provided with a clock distribution input terminal, a first clock output terminal, a second clock output terminal, and a third clock output terminal, said clock distribution input terminal being coupled to said oscillating output terminal, said first clock output terminal, said second clock output terminal, and said third clock output terminal being coupled to said first clock input terminal, said second clock input terminal, and said third clock input terminal respectively, wherein said clock domain distribution module performs integer division operations on the signal at said clock distribution input terminal by three divisors and outputs the results to said first clock output terminal, said second clock output terminal, and said third clock output terminal respectively.

13. The DPLL as of claim 12, wherein said PFD module further comprising:
a counting control terminal for receiving a count value;
an edge detector provided with a detecting input terminal, a detecting clock terminal, and a detecting output terminal, said detecting input terminal being coupled to said first clock input terminal, wherein when either a first edge or a second edge of the signal at said first clock input terminal occurs, said edge detector detects whether or not a first edge of the signal at said reference clock input terminal has occurred, and if the first edge of said reference clock input terminal is detected, then said detecting output terminal outputs an edge-detected signal, else said detecting output terminal outputs an edge-not-detected signal;
a counter coupled to said detecting output terminal, said first clock input terminal, and said counting control terminal, being provided with a counting output terminal coupled to said frequency error output terminal, wherein if said detecting output terminal outputs said edge-detected signal, then said counter outputs a counting result as said frequency error signal at said counting output terminal, resets, and loads the count value, and wherein if said detecting output terminal outputs said edge-not-detected signal, then the counter continues to count on the first edge or the second edge of said counting clock signal; and
a frequency phase converter coupled to said counting output terminal for receiving said counting result, being provided with a converting output terminal coupled to said phase error output terminal, wherein said frequency phase converter performs integration over said counting result and outputs the integral formed as said phase error signal to said converting output terminal.

14. The DPLL as of claim 13, wherein said counter is a down counter, and said count value loaded to said counter is an initial counting value, and a down-counting result of said down counter forms said counting result.

15. The DPLL as of claim 12, wherein said PFD module further comprising:
a phase clock generator coupled to said first clock input terminal by which a plurality of phase clock signals are generated, each said phase clock signal having the same clock frequency as the signal at said first clock input terminal, wherein the initial phases of said phase clock signals are uniformly distributed in the interval of half the cycle of the signal at said first clock input terminal;
an edge phase detector coupled to said reference clock input terminal and said frequency error output terminal, said edge phase detector receiving said phase clock signals, wherein said phase clock signals are used to define a plurality of phase regions, and said edge phase detector receives said reference clock signal and determines that if the two adjacent first edges of said reference clock signal separately occur in one of said phase regions or if they separately occur in two of said phase regions, and wherein if the two adjacent first edges separately occur in two different phase regions, then the distance between said two phase regions is defined as a phase difference, and said frequency error signal at said frequency error output terminal is related to said phase difference; and
a frequency phase converter coupled to said frequency error output terminal for receiving said frequency error signal, said frequency phase converter being provided with a converting output terminal coupled to said phase error output terminal, wherein said frequency phase converter performs integration over said frequency error signal and outputs the integral formed as said phase error signal to said converting output terminal.

16. The DPLL as of claim 11, wherein said digital LF module further comprising:
an error assembly unit coupled to said phase error output terminal and said frequency error output terminal, said error assembly unit being provided with a multiple output terminal and an integral output terminal, wherein through said error assembly unit, the phase error output terminal is selectively coupled to, or not coupled to, said multiple output terminal, and said frequency error output terminal is selectively coupled to, or not coupled to, said multiple output terminal, and wherein through said error assembly unit, said phase error output terminal is selectively coupled to, or not coupled to, said integral output terminal, and said frequency error output terminal is selectively coupled to, or not coupled to, said integral output terminal;
a gain stage provided with an input terminal and an output terminal, said input terminal being coupled to said multiple output terminal, wherein said gain stage multiplies the signal at said input terminal by a gain and outputs a result to said output terminal;
an integrator provided with an input terminal and an output terminal, said input terminal being coupled to said output terminal, wherein said integrator performs integration over the signal at said input terminal and outputs an integral result to said output terminal; and
an adder provided with two input terminals and an output terminal, said two input terminals being coupled to said output terminal of said gain stage and said output terminal of said integrator respectively, wherein said output terminal is coupled to said filtering output terminal, and said adder adds the signals at said two input terminals and outputs a result to said output terminal.

17. The DPLL as of claim 11, wherein said PFD module further comprising:
a counting control terminal for receiving a count value;
an edge detector provided with a detecting input terminal, a detecting clock terminal, and a detecting output terminal, said detecting input terminal being coupled to said first clock input terminal, wherein when either a first edge or a second edge of the signal at said first clock input terminal occurs, said edge detector detects whether or not a first edge of the signal at said reference clock input terminal has occurred, and if the first edge of said reference clock input terminal is detected, then said detecting output terminal outputs an edge-detected signal, else said detecting output terminal outputs an edge-not-detected signal;

a counter coupled to said detecting output terminal, said first clock input terminal, and said counting control terminal, being provided with a counting output terminal coupled to said frequency error output terminal, wherein if said detecting output terminal outputs said edge-detected signal, then said counter outputs a counting result as said frequency error signal at said counting output terminal, resets, and loads the count value, and wherein if said detecting output terminal outputs said edge-not-detected signal, then the counter continues to count on the first edge or the second edge of said counting clock signal; and a frequency phase converter coupled to said counting output terminal for receiving the counting result, being provided with a converting output terminal coupled to the phase error output terminal, wherein said frequency phase converter performs integration over said counting result and outputs the integral formed as said phase error signal to said converting output terminal.

18. The DPLL as of claim 17, wherein said counter is a down counter, and said count value loaded to said counter is an initial counting value, and a down-counting result of said down counter forms said counting result.

19. The DPLL as of claim 18, wherein said PFD module further comprising:
a phase clock generator coupled to said first clock input terminal by which a plurality of phase clock signals are generated, each said phase clock signal having the same clock frequency as the signal at said first clock input terminal, wherein the initial phases of said phase clock signals are uniformly distributed in the interval of half the cycle of the signal at said first clock input terminal;

an edge phase detector coupled to said reference clock input terminal and said frequency error output terminal, said edge phase detector receiving said phase clock signals, wherein said phase clock signals are used to define a plurality of phase regions, and said edge phase detector receives said reference clock signal and determines that if the two adjacent first edges of said reference clock signal separately occur in one of said phase regions or if they separately occur in two of said phase regions, and wherein if the two adjacent first edges separately occur in two different phase regions, then the distance between said two phase regions is defined as a phase difference, and said frequency error signal at said frequency error output terminal is related to said phase difference; and a frequency phase converter coupled to said frequency error output terminal for receiving said frequency error signal, said frequency phase converter being provided with a converting output terminal coupled to said phase error output terminal, wherein said frequency phase converter performs integration over said frequency error signal and outputs the integral formed as said phase error signal to said converting output terminal.

20. The DPLL as of claim 11, further comprising:
a counting control terminal, being an input terminal of said PFD module, for receiving a count value, where said count value is an integer defining a multiple of the transient frequency of the clock signal at said first clock input terminal over the transient frequency of said reference clock signal; and a count value modulator provided with a counting input terminal and a counting output terminal, said counting output terminal being coupled to said counting control terminal, wherein said count value modulator modulates a rational number, as an input, at said counting input terminal into a dynamic integer and outputs a result to said counting output terminal.

21. The DPLL as of claim 20, wherein said count value modulator is a delta-sigma modulator (DSM).

22. The DPLL as of claim 20, wherein said PFD module further comprising:
an edge detector provided with a detecting input terminal, a detecting clock terminal, and a detecting output terminal, said detecting input terminal being coupled to said first clock input terminal, wherein when either a first edge or a second edge of the signal at said first clock input terminal occurs, said edge detector detects whether or not a first edge of the signal at said reference clock input terminal has occurred, and if the first edge of said reference clock input terminal is detected, then said detecting output terminal outputs an edge-detected signal, else said detecting output terminal outputs an edge-not-detected signal;

a counter coupled to said detecting output terminal, said first clock input terminal, and said counting control terminal, being provided with a counting output terminal coupled to said frequency error output terminal, wherein if said detecting output terminal outputs said edge-detected signal, then said counter outputs a counting result as said frequency error signal at said counting output terminal, resets, and loads the count value, and wherein if said detecting output terminal outputs said edge-not-detected signal, then the counter continues to count on the first edge or the second edge of said counting clock signal; and a frequency phase converter coupled to said counting output terminal for receiving the counting result, being provided with a converting output terminal coupled to the phase error output terminal, wherein said frequency phase converter performs integration over said counting result and outputs the integral formed as said phase error signal to said converting output terminal.

23. The DPLL as of claim 22, wherein said counter is a down counter, and said count value loaded to said counter is an initial counting value, and a down-counting result of said down counter forms said counting result.

24. The DPLL as of claim 20, wherein said rational number is a dynamic data of spread-spectrum characteristic.

25. The DPLL as of claim 24, wherein said PFD module further comprising:
an edge detector provided with a detecting input terminal, a detecting clock terminal, and a detecting output terminal, said detecting input terminal being coupled to said first clock input terminal, wherein when either a first edge or a second edge of the signal at said first clock input terminal occurs, said edge detector detects whether or not a first edge of the signal at said reference clock input terminal has occurred, and if the first edge of said reference clock input terminal is detected, then said detecting output terminal outputs an edge-detected signal, else said detecting output terminal outputs an edge-not-detected signal;

a counter coupled to said detecting output terminal, said first clock input terminal, and said counting control terminal, being provided with a counting output terminal coupled to said frequency error output terminal, wherein if said detecting output terminal outputs said edge-detected signal, then said counter outputs a counting result as said frequency error signal at said counting output terminal, resets, and loads the count value, and wherein if said detecting output terminal outputs said edge-not-detected signal, then the counter continues to count on the first edge or the second edge of said counting clock signal; and a frequency phase converter coupled to said counting output terminal for receiving the counting result, being provided with a converting output terminal coupled to the phase error output terminal, wherein said frequency phase converter performs integration over said counting result and outputs the integral formed as said phase error signal to said converting output terminal.

26. The DPLL as of claim 25, wherein said counter is a down counter, and said count value loaded to said counter is an initial counting value, and a down-counting result of said down counter forms said counting result.

\* \* \* \* \*